United States Patent [19]

Yamaguchi

[11] Patent Number: 5,686,703
[45] Date of Patent: Nov. 11, 1997

[54] ANISOTROPIC, ELECTRICALLY CONDUCTIVE ADHESIVE FILM

[75] Inventor: Hiroaki Yamaguchi, Yamato, Japan

[73] Assignee: Minnesota Mining and Manufacturing Company, St. Paul, Minn.

[21] Appl. No.: 357,416

[22] Filed: Dec. 16, 1994

[51] Int. Cl.$^6$ .................................................. H05K 1/02
[52] U.S. Cl. ............................................ 174/259; 428/356
[58] Field of Search ................................. 174/259, 260; 428/344–356

[56] References Cited

U.S. PATENT DOCUMENTS

| | | | |
|---|---|---|---|
| 4,608,434 | 8/1986 | Shimp | 528/422 |
| 4,820,798 | 4/1989 | Hefner, Jr. | 528/322 |
| 5,143,785 | 9/1992 | Pujol et al. | 428/352 |
| 5,238,975 | 8/1993 | Johnson et al. | 428/344 |

FOREIGN PATENT DOCUMENTS

| | | |
|---|---|---|
| 60-008377 | 1/1985 | Japan . |
| 60-133079 | 7/1985 | Japan . |
| 61-009472 | 1/1986 | Japan . |
| 62-177082 | 8/1987 | Japan . |
| 2-206670 | 8/1990 | Japan . |
| 3-223380 | 10/1991 | Japan . |

*Primary Examiner*—Kristine L. Kincaid
*Assistant Examiner*—Paramita Ghosh
*Attorney, Agent, or Firm*—Gary L. Griswold; Walter N. Kirn; Steven E. Skolnick

[57] ABSTRACT

An anisotropic, electrically conductive adhesive film includes an insulating adhesive, electrically conductive particles dispersed in the electrically insulating adhesive, and transparent, spherical glass particles dispersed in the insulating adhesive.

13 Claims, No Drawings

ANISOTROPIC, ELECTRICALLY CONDUCTIVE ADHESIVE FILM

BACKGROUND OF THE INVENTION

1. Field of the Invention

The present invention relates generally to anisotropic, electrically conductive adhesive films and, more specifically, to such films which are used, for example, to connect electronic components to a circuit substrate.

2. Description of the Related Art

When connecting an electronic component (e.g., an integrated circuit (IC) chip) to a circuit substrate (e.g., a tape automated bonding (TAB) tape), it is desirable to use an anisotropic, electrically conductive adhesive film that provides both excellent adhesion and a highly reliable electrical connection.

In general, anisotropic, electrically conductive adhesive films comprise electrically conductive particles dispersed in an electrically insulating adhesive. A highly reliable electrical connection is achieved by providing a stable electrical resistance; that is, an electrical resistance that changes only minimally upon use and aging of the film. Toward this goal, it is important to firmly fix the conductive particles between the electronic component and the circuit substrate with the insulating adhesive because physical shifting of the conductive particles can cause the electrical resistance to change.

Unfortunately, however, the difference between the thermal expansion coefficients of the conductive particles and the insulating adhesive is quite substantial. Usually the thermal expansion coefficient of the adhesive is larger than that of the conductive particles. As a result, temperature changes normally experienced by electronic component assemblies that incorporate anisotropic, electrically conductive adhesive films can cause the insulating adhesive and the conductive particles to expand and contract at different rates. The forces exerted on the particles by the expansion and contraction of the adhesive may result in physical shifting of the conductive particles, which is undesirable.

In addition, anisotropic, electrically conductive adhesive films should, preferably, be transparent so that the electronic component can be properly aligned or registered with the circuit substrate when they are bonded together during manufacture.

Several references disclose anisotropic, electrically conductive adhesive films. For example, Japanese Patent Kokai Publication No. 3-223380 discloses an anisotropic conductive film that includes 20% by volume aluminum oxide or aluminum nitride with a particle size of 10 to 20 µm.

Japanese Patent Kokai Publication No. 2-206670 discloses an anisotropic conductive film containing 3 to 50% by volume of a thermally conductive filler having an average particle size of 1 µm to 50 µm.

Japanese Patent Kokai Publication No. 62-177082 discloses an anisotropic conductive film containing 1 to 30% by weight silica particles having an average primary particle size of 4 mµm to 100 mµm. The conductive particles are metal-clad organic polymer cores.

There remains a need for an anisotropic, electrically conductive adhesive film in which the difference between the thermal expansion coefficients of the insulating adhesive and the conductive particles is small so that the conductive particles can be firmly fixed between the electronic component and the circuit substrate by the insulating adhesive. Preferably, the anisotropic conductive film is sufficiently transparent to permit easy registration of the electronic component and the circuit substrate.

SUMMARY OF THE INVENTION

In one aspect, this invention relates generally to an anisotropic, electrically conductive adhesive film that comprises an electrically insulating adhesive, electrically conductive particles that are dispersed in the insulating adhesive, and transparent spherical glass particles that are dispersed in the insulating adhesive. The glass particles reduce the thermal expansion coefficient of the insulating adhesive while maintaining the transparency of the adhesive film. Thus, an electrical connection that remains stable over time can be provided with an insulating adhesive that is sufficiently transparent to permit easy registration of an electronic component (e.g., an integrated circuit chip) and a circuit substrate (e.g., a tape automated bonding tape).

A wide variety of adhesive resins may be used to provide the insulating adhesive, including those that have conventionally been used in anisotropic, electrically conductive adhesive films.

A wide variety of conductive particles may also be used such as those that have traditionally been incorporated into adhesive films of this type. Nickel particles are particularly preferred. Preferably the conductive particles comprise about 0.5 to 20% by volume, based on the entire volume of the adhesive film, more preferably about 1 to 5% by volume.

The glass particles preferably have an average particle size of less than about 1 µm, more preferably about 0.1 to 1 µm. Having the particles in spherical form, as opposed to flake form, contributes to the provision of a useful adhesive film. Preferably the glass particles have a refractive index of about 1.4 to 1.6 and match the refractive index of the insulating adhesive so as to yield a transparent adhesive that permits easy registration of an electronic component and a circuit substrate. The glass particles typically comprise about 10 to 40% by volume, based on the entire volume of the adhesive film, more preferably about 10 to 30% by volume.

The anisotropic, electrically conductive adhesive films of the invention may be used to prepare an electronic assembly comprising an electronic component (e.g., an integrated circuit chip) bonded to a circuit substrate by the adhesive film.

DETAILED DESCRIPTION OF THE PREFERRED EMBODIMENTS

In general, and in one embodiment, this invention relates to an anisotropic, electrically conductive adhesive film comprising an electrically insulating adhesive, electrically conductive particles dispersed in the adhesive, and transparent, spherical glass-particles dispersed in the adhesive. Incorporating the transparent, spherical glass particles into the insulating adhesive reduces the thermal expansion coefficient (TEC) of the adhesive (so that it is closer to that of the conductive particles) while maintaining the transparency of the adhesive film. (The TEC may be measured as a linear TEC using a thermomechanical analyzer where the TEC is measured against a change in temperature while a constant tension is applied to the adhesive film.) Thus, an anisotropic, electrically conductive adhesive film that displays a highly reliable electrical connection, excellent adhesion (90° peel adhesion) between an electronic component and a circuit substrate, and sufficient transparency to permit easy registration of the electronic component and the circuit substrate is provided.

A wide variety of electrically insulating adhesives may be successfully used in the anisotropic, electrically conductive adhesive films of the invention. In general, any adhesive resin that has traditionally been used as an insulating adhesive in anisotropic, electrically conductive adhesive films may be employed in the adhesive films of the invention.

Specific examples of useful adhesives include acrylate polymers, ethylene-acrylate copolymers, ethylene-acrylic acid copolymers, ethylene-vinyl acetate copolymers, polyethylene, ethylene-propylene copolymers, acrylonitrile-butadiene copolymers, styrene-butadiene block copolymers, styrene-butadiene-styrene block copolymers, carboxylated styrene-ethylene-butadiene-styrene block copolymers, epoxidized styrene-ethylene-butadiene-styrene block copolymers, styrene-isoprene block copolymers, polybutadiene, ethylene-styrene-butylene block copolymers, polyvinyl butyral, polyvinyl formal, phenoxy resins, polyesters, polyurethanes, polyamides, polyvinyl acetal, polyvinyl ethers, polysulfones, nitrile-butadiene rubber, styrene-butadiene rubber, chloroprene rubbers, cyanate ester polymers, epoxy resins, silicone resins, phenol resins, photocurable resins, anaerobic resins, and the like. These adhesive resins may be used independently or in blends of two or more.

If necessary, a curing agent and/or a curing catalyst may be used to increase the molecular weight of the insulating adhesive, either by cross-linking or polymerizaton. Examples of curing agents and curing catalysts that may be used in the insulating adhesive include those that conventionally have been used in conjunction with the adhesive resins described hereinabove.

A wide variety of other additives may be usefully incorporated into the insulating adhesives used in the invention such as tackifiers, antioxidants, surfactants, and the like, so long as they are employed in an amount that does not materially, adversely affect the performance properties of the anisotropic, electrically conductive adhesive film.

Examples of acceptable tackifier are terpene resins, terpene phenol resins, rosin resins, xylene resins, alkylphenol resins, dicyclopentadiene resins, cumarone resins, aromatic petroleum resins, and the like. Alkylphenols, mercaptans, phosphites, amines, and the like may be used as antioxidants. The surfactants may be nonionic, cationic, anionic, or amphoteric in nature.

A wide variety of electrically conductive particles may be used in the anisotropic, electrically conductive adhesive film of the invention, including those that conventionally have been incorporated into such films. Specific examples of suitable conductive particles are particles formed of one or more conductive metals such as nickel, aluminum, silver, copper, tin, lead, gold, zinc, platinum, cobalt, and their alloys (e.g. solders). Agglomerated metal particles, molten metal particles, and metal-clad polymeric particles (using any of the aforementioned metals) may also be used.

Nickel particles are especially preferred because they are chemically stable in the intended use environment, thereby promoting a good electrical connection between the electronic component and the circuit substrate.

Typically, the conductive particles are incorporated in an amount of about 0.5 to 20% by volume, preferably from 1 to 5% by volume, based on the entire volume of the anisotropic, electrically conductive adhesive film.

The glass particles used in the anisotropic, electrically conductive adhesive films of the invention are transparent so as to not detract from the transparency of the adhesive film, thereby making it easier to register electronic components and the circuit substrate. By "transparent" it is meant that the refractive index of the glass particles is matched to that of the insulating adhesive. By "matched" it is meant that the refractive indices of the glass particles and the insulating adhesive are selected such that the presence of the glass particles in the insulating adhesive does not materially reduce the inherent transparency of the adhesive. Preferably, the refractive indices of the glass particles and the insulating adhesive are in the same range or have overlapping ranges. Most preferably, the refractive indices are the same.

Most of the insulating adhesives useful in the invention have a refractive index of about 1.4 to 1.6. Thus, the glass particles preferably have a refractive index in about the same range, most preferably a refractive index of about 1.5. The refractive index of the glass particles is measured relative to air at the same temperature and using the sodium D line (i.e., a wavelength of 589.3 nm).

Preferably, the glass particles are spherical in shape, as opposed to, for example, being in flake form. Spherical glass particles are believed to contribute to a stable electrical contact between the electronic component and the circuit substrate due to a more uniform distribution of the strain forces imposed on the glass particles by the insulating adhesive as it expands and contracts during normal use. When the glass particles are non-spherical, for example, in flake form, the viscosity of the anisotropic, electrically conductive adhesive film during application and subsequent curing thereof increases, thereby degrading the stability of the electrical contact between the electronic component and the circuit substrate because it becomes more difficult to form stable, electrically conductive pathways.

The glass particles used in the present invention preferably have a number average particle size that is less than or equal to about 1.0 μm. More preferably, the number average particle size is about 0.1 to 1.0 μm. When the particle size exceeds about 1.0 μm, contact between the conductive particles and the circuit substrate may be impeded.

The particle size distribution is defined by a cumulative volume ratio of a 75% cumulative volume to a 25% cumulative volume: D75/D25. D75 refers to the maximum particle size of the glass particles found in a cumulative volume that represent 75% of the particles by volume. D25 refers to the maximum particle size of the glass particles found in a cumulative volume that represent 25% of the particles by volume.

$$D75/D25 = \frac{\text{maximum particle size in a 75\% cumulative volume}}{\text{maximum particle size in a 25\% cumulative volume}}.$$

In the present invention, the D75/D25 ratio is preferably in the range of about 1 to 2. When the ratio exceeds this range, the probability that large particles will be present (which could disrupt the contact between the conductive particles, the electronic component, and the circuit substrate) increases.

The glass particles are added in an effective amount; that is, an amount that balances the beneficial effect that the glass particles provide in reducing the thermal expansion coefficient of the insulating adhesive, so as to suppress the increase in electrical resistance upon aging, with the need for excellent adhesion between the electronic component and the circuit substrate. When the glass particle loading is less than about 10% by volume, the beneficial effect of reducing the thermal expansion coefficient of the insulating adhesive and suppressing the increase in electrical resistance tends to decline. On the other hand, when the glass particle loading exceeds about 40% by volume, the strength of the adhesive bond between the electronic component and the circuit substrate may decrease. Within these parameters, the glass particles are usually added in an amount of about 10 to 40% by volume, more preferably about 10 to 30% by volume, based on the entire volume of the anisotropic, electrically conductive adhesive film.

The thickness of the anisotropic, electrically conductive adhesive film depends on the intended application and the adherends (electronic components and circuit substrates) that are to be bonded together. The adhesive film should not be so thin that it becomes difficult to fill the volumetric space between the electronic component and the circuit substrate. Nor should the adhesive film be so thick that it can not readily accommodate electronic assemblies having a fine pitch. Within these guidelines, the thickness of the adhesive film is typically about 3 to 100 µm, more preferably about 10 to 30 µm. At thicknesses less than about 3 µm, the adhesive film may be too thin to sufficiently fill the volumetric space between the electronic component and the circuit substrate, resulting in an incomplete, or an unreliable, electrical connection, while thicknesses exceeding about 100 µm may be too large to accommodate fine pitches.

The anisotropic, electrically conductive adhesive films of the invention may be produced by the same methods used to produce conventional anisotropic, electrically conductive adhesive films, except accompanied by the addition of the glass particles. For example, the insulating adhesive may be dissolved in a suitable solvent, and the conductive particles and the glass particles dispersed in the resulting solution. The order of addition of the conductive particles and the glass particles is not critical. They may be added sequentially in any order, or they may be added simultaneously. The resulting dispersion of glass and conductive particles in the insulating adhesive solution may be coated onto a suitable release liner (e.g. a polyethylene terephthalate (PET) film that has a silicone release surface) and dried to obtain the anisotropic, electrically conductive adhesive film.

The anisotropic, electrically conductive adhesive films of the present invention may be used in the same manner as conventional anisotropic conductive films. For example, the film is removed from the release liner and placed on a surface of a circuit substrate (e.g., a polyester TAB) to which an electronic component (e.g., an IC chip) is to be connected, and is secured thereto using a contact bonding machine and, optionally, heat. The electrodes of the electronic component and the electrodes of the circuit substrate are registered through the anisotropic, electrically conductive adhesive film, and then the electronic component is fixed to the circuit substrate with a thermal contact bonding machine. Thus, the electronic component and the circuit substrate are connected both electrically and mechanically (i.e., adhesively).

The present invention will be illustrated by the following non-limiting examples.

EXAMPLES

A series of examples and comparative examples was prepared as follows. A mixture of polyvinyl butyral resins for providing the insulating adhesive was dissolved in a solvent system comprising methyl ethyl ketone, ethanol and toluene (at a 11:61:28 volume ratio). Nickel particles were added to the adhesive solution and dispersed in a ball mill. The resulting nickel particles had an average particle size of 6.7 to 10.5 µm and were incorporated in an amount equal to 2.0% by volume, based on the entire volume of the anisotropic, electrically conductive adhesive film.

A phenolic resin mixture for crosslinking the adhesive, and transparent glass particles were added to the dispersion of nickel particles in the adhesive solution, mixed, and agitated to obtain a stock liquid. The stock liquid was coated onto a surface of silicone-treated PET release liner, and dried to obtain an anisotropic, electrically conductive adhesive film having a thickness of 13 µm.

Various examples and comparative examples were produced in which the size of the transparent glass particles was varied and in which the glass particles were replaced by particles formed of other materials, all as explained more fully hereinbelow.

The resulting adhesive films were sandwiched between an IC chip consisting of a silicon substrate measuring 6.8 mm×6.8 mm×0.5 mm (thickness) on which aluminum circuits and gold bumps each having a size of 100 µm×100 µm×25 µm (thickness) were formed at a 200 µm pitch, and a PET circuit substrate on which aluminum electrodes were formed at the same pitch, and heat bonded to form a sample.

The different examples and comparative examples (C.E.) were then evaluated for electrical resistance using the following test method and with the results shown in the tables below.

A total electrical resistance was measured through the following electrically conductive pathway: TAB conductor/ anisotropic, electrically conductive adhesive film/IC chip electrode/anisotropic, electrically conductive adhesive film/ TAB conductor. The pathway represents the total of the conductor resistances and contact resistances. More specifically, a direct current of 1 mA was applied between the TAB conductor terminals, the voltage generated between the terminals was measured, and the electrical resistance mathematically calculated as the ratio of the generated voltage to the applied current.

TABLE 1

| Example | Type of Particles | Particle Size (µm) | Particle Loading (vol. %) | Ability to Register IC Chip with TAB |
|---------|-------------------|--------------------|---------------------------|---------------------------------------|
| 1 | Glass | 0.2 | 40 | Good because of transparency |
| C.E. 1 | Titanium oxide | 0.2 | 5 | Difficult due to opacity |

Table 1 shows that incorporating spherical glass particles according to the invention into an anisotropic, electrically conductive adhesive film does not materially affect the transparency of the film. The film remained sufficiently transparent to permit easy registration of the IC chip and the TAB. When the glass particles were replaced with titanium oxide particles of the same size, but at a much lower particle loading level, the opacity of the film increased making it more difficult to register the IC chip and the TAB.

TABLE 2

| | Example 2 | Comparative Example 2 |
|---|-----------|----------------------|
| Particle Shape | Sphere | Flake |
| Type of Particles | Glass | Mica |
| Particle Size (µm) | 1.0 | Average thickness (<0.7) Weighted average diameter (20) |
| Particle Loading (vol. %) | 15 | 5 |
| Original Resistance (Ω) | | |
| Maximum | 0.38 | 0.44 |
| Average | 0.32 | 0.35 |

TABLE 2-continued

|  | Example 2 | Comparative Example 2 |
|---|---|---|
|  | Resistance After Thermal Cycling (Ω) | |
| Maximum | 0.57 | >100 |
| Average | 0.33 | 1.23 |

Table 2 shows the effect of replacing spherical glass particles according to the invention with mica flakes. The original resistance for the adhesive film of example 2 was less than that for comparative example 2. More importantly, after example 2 and comparative example 2 were subjected to a thermal cycling test (i.e., an accelerated aging test), the resistance of comparative example 2 increased substantially, while example 2 was not significantly adversely affected. Thus the adhesive film of example 2 is more stable than the adhesive film of comparative example 2. The thermal cycling test had the following profile: 1000 hours of repetitive cycling from −20° C. (2 hour hold), followed by heating over 2 hours to 70° C./90% relative humidity (RH), hold for 2 hours at 70° C./90% RH, followed by cooling over 2 hours to −20° C. The total number of cycles was 125.

TABLE 3

| Example | Particle Size (μm) | Particle Loading (Vol. %) | Original Resistance (Ω) | | Resistance After Thermal Cycling (Ω) | |
|---|---|---|---|---|---|---|
|  |  |  | Max. | Avg. | Max. | Avg. |
| 3 | 0.2 | 10 | 0.43 | 0.34 | 0.56 | 0.39 |
| 4 | 0.3 | 10 | 0.38 | 0.31 | 0.48 | 0.34 |
| 5 | 1.0 | 15 | 0.38 | 0.32 | 0.57 | 0.33 |
| C.E. 3 | 2.0 | 6 | 0.43 | 0.33 | >100 | 6.22 |
| C.E. 4 | 4.5 | 6 | 0.40 | 0.33 | 9.68 | 4.00 |
| C.E. 5 | 12.0 | 6 | 0.44 | 0.34 | >100 | 6.26 |

Table 3 compares the effect of replacing spherical glass particles according to the invention (examples 3 to 5) with hard, spherical silicone resin particles (comparative examples 3 to 5). Table 3 also shows the effect of varying particle size and loading. The thermal cycling is the same as described in conjunction with example 2 and comparative example 2.

TABLE 4

| Example | Particle Size (μm) | Particle Loading (Vol. %) | Original Resistance (Ω) | | Resistance After Thermal Cycling (Ω)* | |
|---|---|---|---|---|---|---|
|  |  |  | Max. | Avg. | Max. | Avg. |
| 6 | 0.3 | 10 | 0.38 | 0.31 | 0.48 | 0.34 |
| 7 | 0.3 | 20 | 0.41 | 0.32 | 0.57 | 0.37 |
| 8 | 0.3 | 30 | 0.38 | 0.31 | 0.52 | 0.38 |
| 9 | 0.3 | 40 | 0.39 | 0.33 | 1.39 | 0.49 |
| 10 | 1.0 | 11 | 0.43 | 0.37 | 3.21 | 0.68 |
| 11 | 1.0 | 20 | 0.47 | 0.38 | 5.22 | 0.78 |
| 12 | 1.0 | 30 | 0.41 | 0.34 | 0.51 | 0.38 |
| C.E. 6 | 0.2 | 6 | 0.42 | 0.34 | >100 | 0.75 |
| C.E. 7 | 1.0 | 5 | 0.38 | 0.31 | >100 | 0.40 |

*Samples displaying a maximum resistance of 100 Ω or greater were excluded when calculating the average resistance.

Table 4 shows the effect of varying the particle size and the particle loading on the electrical resistance of the electronic assembly. The thermal cycling is the same as described in conjunction with example 2 and comparative example 2. Examples 6 to 9 show that relatively small diameter spherical glass particles can be successfully incorporated into the anisotropic, electrically conductive adhesive films of the invention. Even after 1000 hours of thermal cycling, the electrical resistance of these examples had not changed substantially and were still useful. Comparative example 6, on the other hand, using glass particles of nominally the same size, but at a lower particle loading, showed a significant increase in electrical resistance after thermal cycling. Similar conclusions can be drawn upon comparing examples 10 through 12 with comparative example 7. Examples 6 to 9, as compared to examples 10 to 12, show the benefit of using glass particles of smaller diameter.

What is claimed is:

1. An anisotropic, electrically conductive adhesive film comprising an electrically insulating adhesive, electrically conductive particles dispersed in the insulating adhesive, and transparent spherical glass particles dispersed in the insulating adhesive wherein the particle size distribution of the glass particles, defined by a cumulative volume ratio of the maximum particle size of the glass particles found in a cumulative volume that represent 75% of the particles by volume to the maximum particle size of the glass particles found in a cumulative volume that represent 25% of the particles by volume, is 1 to 2.

2. An anisotropic, electrically conductive adhesive film according to claim 1, wherein the glass particles have an average particle size of less than about 1 μm.

3. An anisotropic, electrically conductive adhesive film according to claim 2, wherein the glass particles have an average particle size of about 0.1 to 1 μm.

4. An anisotropic, electrically conductive adhesive film according to claim 1, wherein the glass particles have a refractive index of about 1.4 to 1.6.

5. An anisotropic, electrically conductive adhesive film according to claim 1, wherein the glass particles comprise about 10 to 40% by volume, based on the entire volume of the adhesive film.

6. An anisotropic, electrically conductive adhesive film according to claim 5, wherein the glass particles comprise about 10 to 30% by volume, based on the entire volume of the adhesive film.

7. An anisotropic, electrically conductive adhesive film according to claim 1, wherein the conductive particles comprise about 0.5 to 20% by volume, based on the entire volume of the adhesive film.

8. An anisotropic, electrically conductive adhesive film according to claim 7, wherein the conductive particles comprise about 1 to 5% by volume, based on the entire volume of the adhesive film.

9. An anisotropic, electrically conductive adhesive film according to claim 7, wherein the conductive particles are nickel particles.

10. An anisotropic, electrically conductive adhesive film according to claim 1, wherein the insulating adhesive is formed from a material selected from the group consisting of acrylate polymers, ethylene-acrylate copolymers, ethylene-acrylic acid copolymers, ethylene-vinyl acetate copolymers, polyethylene, ethylene-propylene copolymers, acrylonitrile-butadiene copolymers, styrene-butadiene block copolymers, styrene-butadiene-styrene block copolymers, carboxylated styrene-ethylene-butadiene-styrene block copolymers, epoxidized styrene-ethylene-butadiene-styrene block copolymers, styrene-isoprene block copolymers, polybutadiene, ethylene-styrene-butylene block copolymers, polyvinyl butyral, polyvinyl formal, phenoxy resins, polyesters, polyurethanes, polyamides, polyvinyl acetal, polyvinyl ethers, polysulfones, nitrile-butadiene rubber, styrene-butadiene rubber, chloroprene rubbers, cyanate ester polymers, epoxy resins, silicone resins, phenol resins, photocurable resins, anaerobic resins, and blends of any of the foregoing.

11. An anisotropic, electrically conductive adhesive film according to claim 1 wherein the refractive indices of the insulating adhesive and the glass particles are matched.

12. An electronic assembly comprising an electronic component bonded to a circuit substrate by an anisotropic, electrically conductive adhesive film, wherein the adhesive film comprises an electrically insulating adhesive, electrically conductive particles dispersed in the insulating adhesive, and transparent spherical glass particles dispersed in the insulating adhesive, wherein the particle size distribution of the glass particles, defined by a cumulative volume ratio of the maximum particle size of the glass particles found in a cumulative volume that represent 75% of the particles by volume to the maximum particle size of the glass particles found in a cumulative volume that represent 25% of the particles by volume, is 1 to 2.

13. An electronic assembly according to claim 12 wherein the electronic component is an integrated circuit chip.

* * * * *

UNITED STATES PATENT AND TRADEMARK OFFICE
CERTIFICATE OF CORRECTION

PATENT NO. : 5,686,703
DATED : November 11, 1997
INVENTOR(S) : Hiroaki Yamaguchi Page 1 of 1

It is certified that error appears in the above-identified patent and that said Letters Patent is hereby corrected as shown below:

Title page, column 2,
Under "Foreign Patent Documents, "the following should be added:
-- 85-207847    7/1985  Japan
86-058411      1/1986  Japan
85-052419      1/1985  Japan Signed and Sealed this Twenty-first Day of August, 2001

*Attest:*

*Nicholas P. Godici*

*Attesting Officer*

NICHOLAS P. GODICI
*Acting Director of the United States Patent and Trademark Office*